(12) United States Patent
Dockweiler

(10) Patent No.: US 7,990,133 B2
(45) Date of Patent: Aug. 2, 2011

(54) NON-INTRUSIVE ELECTRIC ALTERNATING CURRENT SENSOR

(75) Inventor: Robert Dockweiler, Wantagh, NY (US)

(73) Assignee: Carbon 612 Corporation, Mineola, NY (US)

( * ) Notice: Subject to any disclaimer, the term of this patent is extended or adjusted under 35 U.S.C. 154(b) by 116 days.

(21) Appl. No.: 12/384,528

(22) Filed: Apr. 6, 2009

(65) Prior Publication Data

US 2010/0253322 A1 Oct. 7, 2010

(51) Int. Cl.
*G01R 15/18* (2006.01)
(52) U.S. Cl. ........................................................ 324/127
(58) Field of Classification Search .................... None
See application file for complete search history.

(56) References Cited

U.S. PATENT DOCUMENTS

| | | | | |
|---|---|---|---|---|
| 5,594,332 A | 1/1997 | Harman et al. | ............... | 324/127 |
| 6,056,226 A | 5/2000 | Green | ............... | 242/395 |
| 6,351,114 B1 | 2/2002 | Iwasaki et al. | ............ | 324/117 R |
| 6,702,608 B2 | 3/2004 | Brennan | ........................ | 439/501 |
| 7,230,413 B2 * | 6/2007 | Zhang et al. | ............... | 324/117 R |
| 2006/0082356 A1 | 4/2006 | Zhang et al. | ............. | 324/117 R |

OTHER PUBLICATIONS

International Search Report and Written Opinion dated Apr. 30, 2010 for corresponding International Application No. PCT/US2010/026182.

* cited by examiner

*Primary Examiner* — Jermele M Hollington
(74) *Attorney, Agent, or Firm* — Ohlandt, Greeley, Ruggiero & Perle, L.L.P.

(57) ABSTRACT

A method and a current sensor for measuring current in a conductor are provided. The current sensor has a flexible coil having a first end and a second end and a mounting ring. The flexible coil is wrapped within the mounting ring to form a closed loop. The mounting ring has a first hole and a second hole drilled tangentially to an inner diameter of the mounting ring. The first end of the flexible coil extends through the first hole of the mounting ring and the second end of the flexible coil extends through the second hole of the mounting ring. The mounting ring has a channel therethrough that provides an access point so that the mounting ring can be easily flexed open or closed.

19 Claims, 3 Drawing Sheets

NON-INTRUSIVE ELECTRIC ALTERNATING CURRENT SENSOR

BACKGROUND OF THE DISCLOSURE

1. Field of the Disclosure

The present disclosure relates to a non-intrusive electric alternating current sensor for measuring alternating current in a circuit conductor.

2. Description of Related Art

Traditional methods used to measure alternating current in a circuit conductor require the installation of a heavy, cumbersome and expensive inductive pickup coil around, or in close proximity to, the conductor being monitored.

Traditional current sensors have several functional drawbacks, namely that the measurement of the alternating current is inaccurate. Furthermore, traditional current sensors are difficult to calibrate and have limited flexibility that limits their use to different sized and shaped conductors.

Accordingly, a need exists for a lightweight, compact and flexible current sensor that can accurately measure and moderate alternating current, and which is easy to install

SUMMARY OF THE DISCLOSURE

The present disclosure provides a non-intrusive electric alternating current sensor that measures alternating current in a circuit conductor and is lightweight, compact and flexible.

The present disclosure also provides a non-intrusive electric alternating current sensor that can be removed from the circuit conductor whose current it is measuring without disconnecting the conductor from the circuit.

The present disclosure further provides a reusable non-intrusive electric alternating current sensor that can be used with different sized and shaped conductors to measure current flow therein.

The present disclosure still further provides a non-intrusive electric alternating current sensor that provides a uniform pressure around the circuit conductor.

These and other advantages and benefits of the present disclosure are provided by a non-intrusive electric alternating current sensor having a flexible coil that is wrapped around the inside of a mounting ring to form a closed loop. The closed loop has a constant inner diameter and a constant circumference. The flexible coil is further wrapped around a circuit conductor that is monitored by the current sensor.

The above-described and other advantages, features, and benefits, advantages of the present disclosure will be appreciated and understood by those skilled in the art from the following detailed description, drawings, and appended claims.

DETAILED DESCRIPTION OF THE INVENTION

Figure 1:
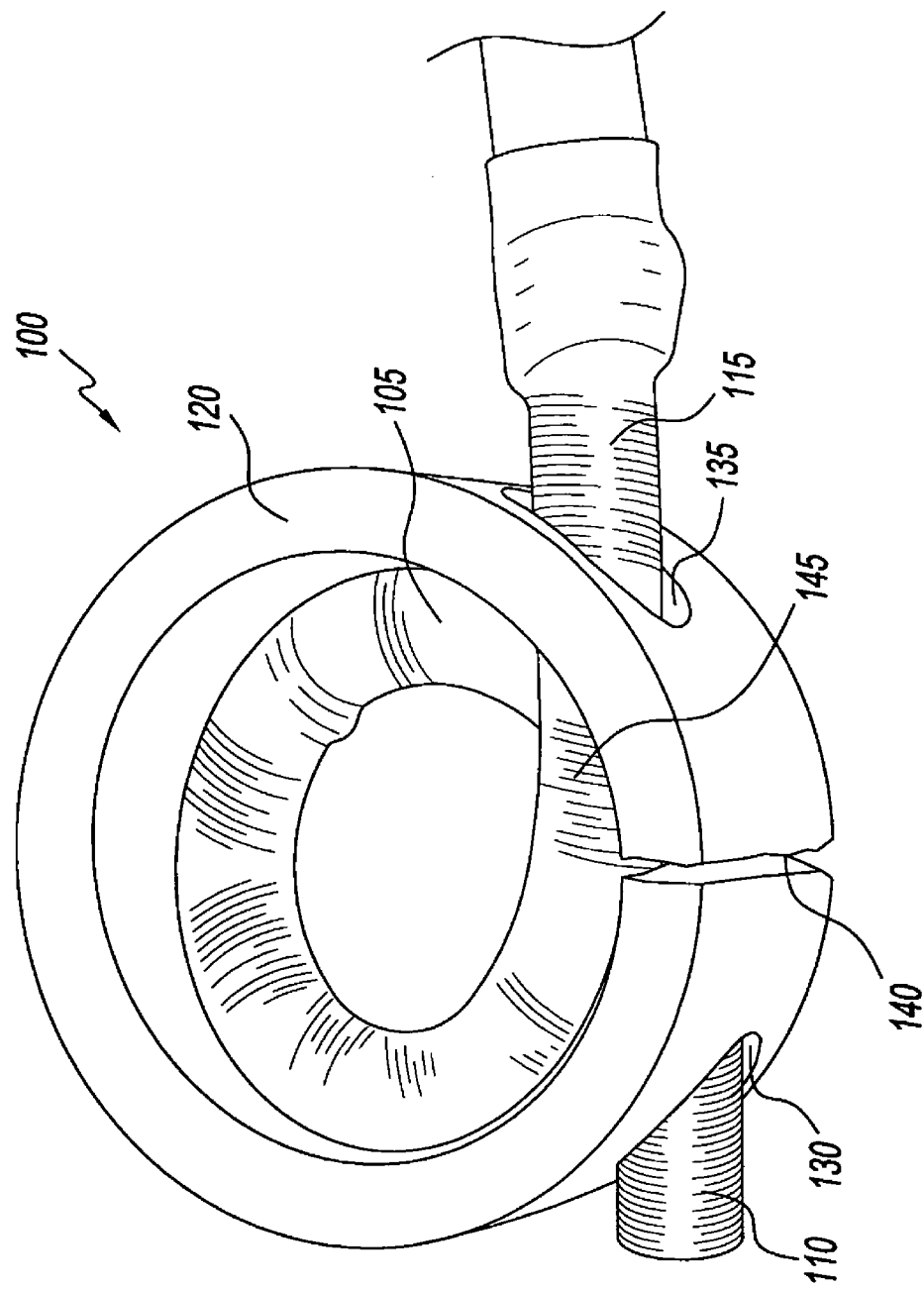
FIG. 1 is a front perspective view of the non-intrusive electric alternating current sensor of the present disclosure; having a flexible coil wrapped within a mounting ring.

Referring to the drawings and, in particular, FIG. 1, a non-intrusive electric alternating current sensor generally referred to by reference number 100 is shown. Current sensor 100 has a flexible coil 105 having a first end 110 and a second end 115. Flexible coil is wrapped around the inside of a mounting ring 120 so that it forms a loop having a constant inner diameter and a constant circumference. Flexible coil 105 is further wrapped around a circuit conductor (not shown) that is monitored by current sensor 100. One advantage of current sensor 100 is that the circuit conductor does not need to be disconnected from the circuit when current sensor 100 is removed from the circuit conductor. Thus, current sensor 100 is very easy to install. In one embodiment, flexible coil 105 is an open-ended, air core toroidal inductive pickup coil.

In one embodiment, mounting ring 120 is manufactured from a non-conductive material, such as polyvinyl chloride. However, mounting ring 120 can be manufactured from any other non-conductive material that provides a combination of flexibility and rigidity including polyvinyl chloride (PVC), acrylonitrile butadiene styrene (ABS), high-density polyethylene (HDPE), or any combinations thereof. By providing a combination of both flexibility and rigidity, mounting ring 120 has a resiliency factor that allows it to spring-back into place when opened and closed.

Figure 2:
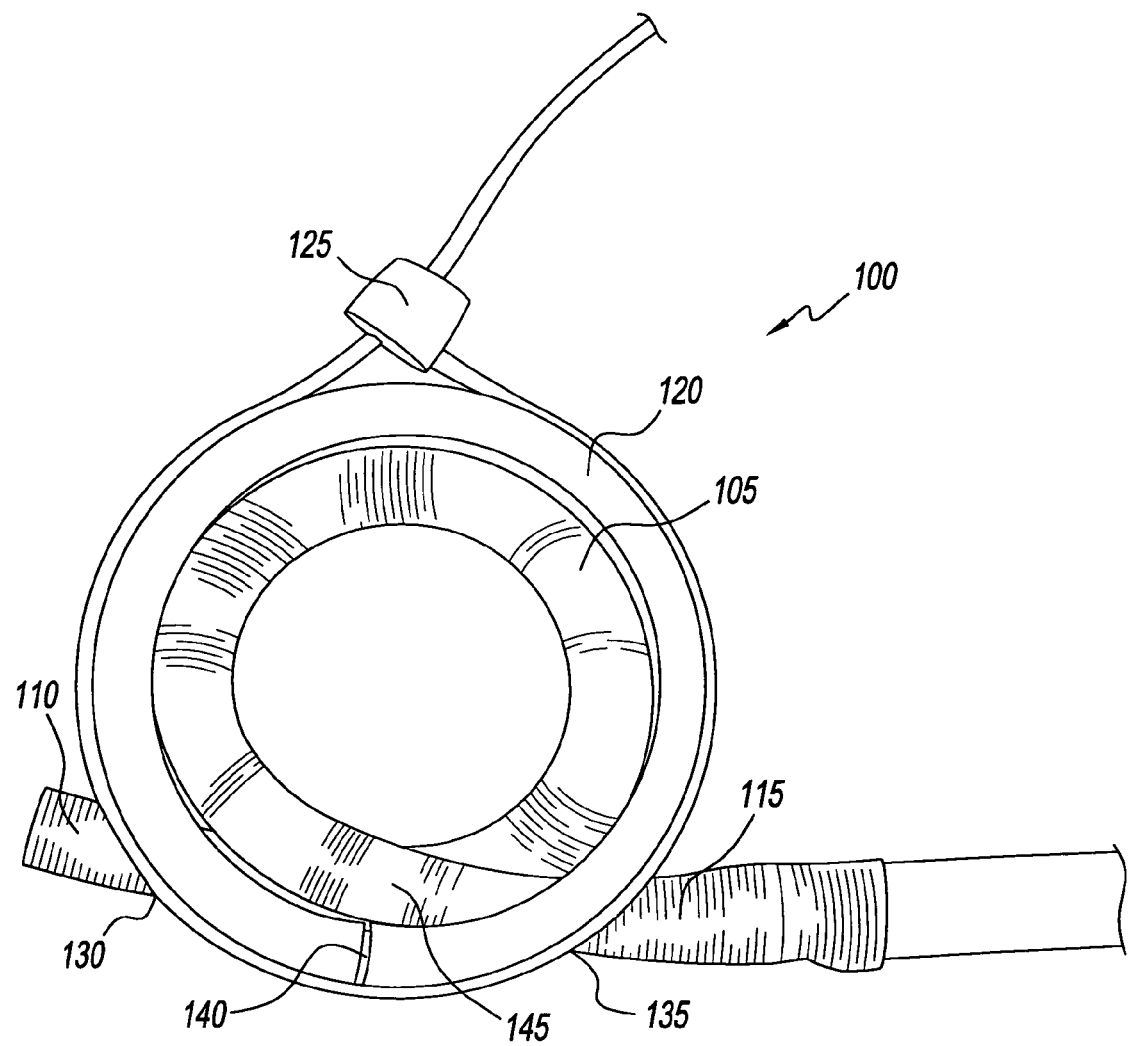
FIG. 2 is a front perspective view of the non-intrusive electric alternating current sensor of FIG. 1, further comprising a cable tie secured around the mounting ring.
Figure 5:
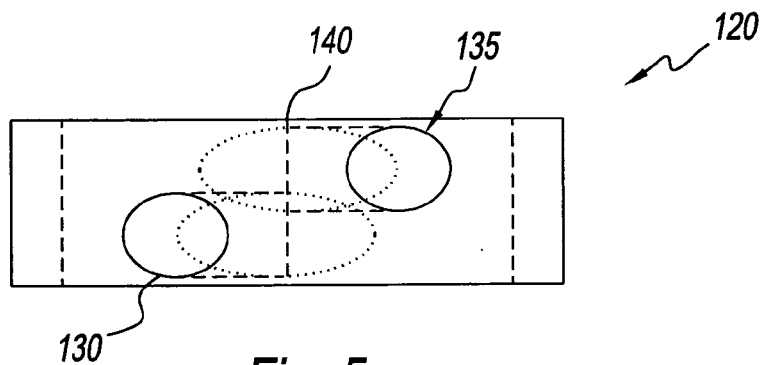
FIG. 5 is a top view of the mounting ring of FIG. 3.

As illustrated in FIG. 2, mounting ring 120 can be secured with a device 125 that is wrapped around the outside diameter of mounting ring 120. The present disclosure contemplates a number of methods for securing mounting ring 120. In the shown embodiment, device 125 is a cable tie.

Mounting ring 120 can have a first hole 130 and a second hole 135 therein. First hole 130 and second hole 135 are drilled tangentially to inside diameter D of mounting ring 120 so that flexible coil 105 bends smoothly as it enters mounting ring 120. Another advantage of drilling first hole 130 and second hole 135 tangentially to inside diameter D is to provide for minimal frictional engagement of flexible coil 105 with mounting ring 120.

Mounting ring 120 can have a channel 140 through the entire height H. Channel 140 provides an access point so that mounting ring 120 can be easily flexed open or closed.

Referring to FIGS. 3-6, first hole 130 and second hole 135 are aligned so that flexible coil 105 has a single crossover point 145 and a crossover angle 150. The loop formed by flexible coil 105 ranges from about 360° to about 400°. In one embodiment, flexible coil 105 has a 360° loop. Crossover angle 150 of flexible coil 105 can range from 130° to 140°, or can be about 135°.

Figure 3:
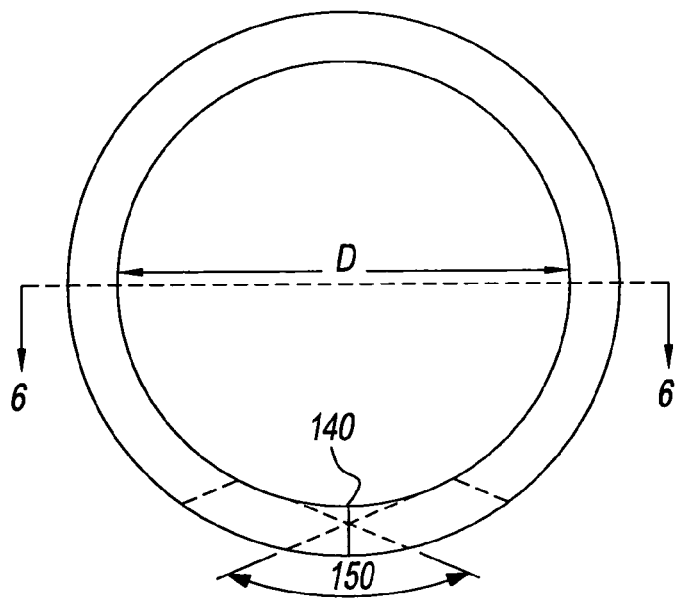
FIG. 3 is a front view of the mounting ring of the non-intrusive electric alternating current sensor of FIG. 1.
Figure 4:
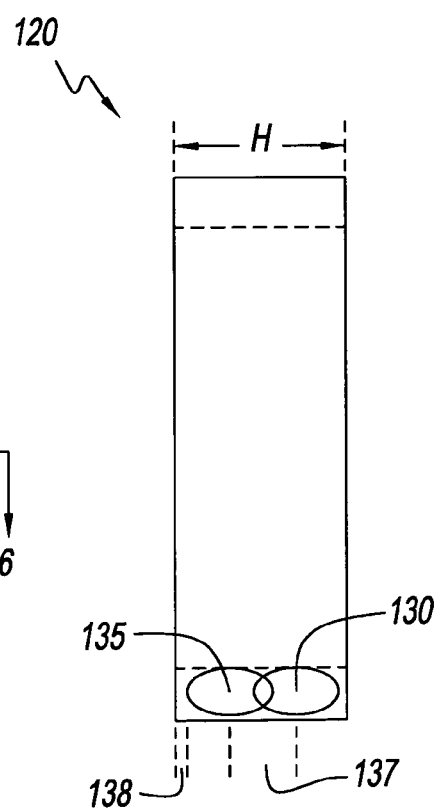
FIG. 4 is a side view of the mounting ring of FIG. 3.
Figure 6:
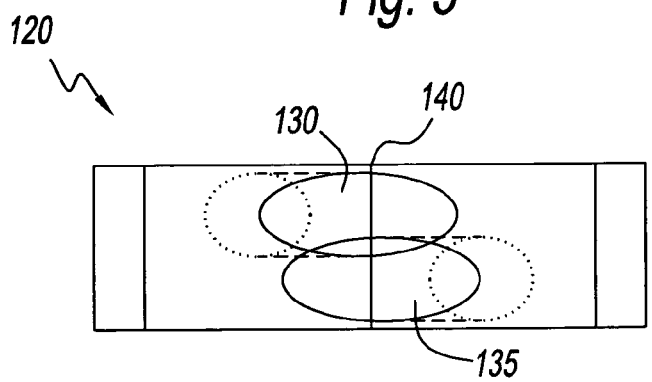
FIG. 6 is a cross-sectional view of the mounting ring of FIG. 3, taken along line 6-6 of FIG. 3.

First hole 130 and second hole 135 can be placed at any position along circumference C of mounting ring 120. However, it is preferable that first hole 130 and second hole 135 are positioned so that the size of the loop formed by flexible coil 105 is minimized. The size of the loop formed by flexible coil 105 is smallest when first hole 130 and second hole 135 are positioned closest to channel 140, as illustrated in FIG. 3.

Another advantage of current sensor 100 is that the circumference and inner diameter of flexible coil 105 remain constant when installed in mounting ring 120 so that the pressure around the circuit conductor is uniform throughout. In addition, the inside of mounting ring 120 is machined to allow flexible coil 105 to enter first hole 130 and second hole 135 of mounting ring 120 tangentially with minimal frictional engagement.

In one embodiment, mounting ring 120 can have a height H that ranges from 0.5 inches to 0.7 inches, or can be about 0.6 inches. Inner diameter D of mounting ring 120 can range from 1.25 inches to 4.15 inches, and in certain embodiments, can be 1.38 inches, 1.61 inches, 2.07 inches, 2.47 inches, 3.07 inches, or 4.03 inches, each +/−0.1 inch. The diameter of holes 135 can be from 0.23 inches to 0.27 inches, or about 0.25 inches. A spacing 137 between the centers of holes 130 or 135 can be between 0.19 inches and 0.21 inches, or about 0.20 inches. A spacing 138 from the edge of holes 130 and 135 to the edge of mounting ring 120 can be between 0.029 inches and 0.031 inches, or about 0.30 inches.

The present disclosure further provides a method for measuring alternating current using current sensor 100. The method includes inserting first end 110 of flexible coil 105 through first hole 130. First end 110 of flexible coil 105 is wrapped around circumference C of mounting ring 120 and crossed over second end 115 of flexible coil 105 to form crossover point 145 and crossover angle 150. First end 110 is then inserted into second hole 135 to form a closed loop. First end 110 is pulled through second hole 135 to the desired length. In an exemplary embodiment, cable tie 125 is wrapped around mounting ring 120.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiments disclosed as the best mode contemplated, but that the disclosure will include all embodiments falling within the scope of the appended claims.

What is claimed is:

1. A non-intrusive electric alternating current sensor that monitors a circuit conductor comprising:
    a mounting ring, the mounting ring having a first hole and a second hole drilled tangentially to an inner diameter of the mounting ring, the mounting ring having a channel extending through an entire height of the mounting ring; and
    a flexible coil having a first end and a second end, the flexible coil wrapped around an inside of the mounting ring to form a closed loop, the closed loop having a crossover point, the first end of the flexible coil extending through the first hole of the mounting ring, the second end of the flexible coil extending through the second hole of the mounting ring, wherein the channel of the mounting ring provides an access point so that the mounting ring can be easily flexed open or closed.

2. The current sensor of claim 1, wherein the flexible coil has a constant circumference.

3. The current sensor of claim 1, wherein the inner diameter of the mounting ring is constant.

4. The current sensor of claim 1, wherein the flexible coil is an open-ended, air core toroidal inductive pickup coil.

5. The current sensor of claim 1, wherein the mounting ring is manufactured from a material selected from the group consisting of polyvinyl chloride, acrylonitrile butadiene styrene, high-density polyethylene, and any combinations thereof 6. The current sensor of claim 1, further comprising a cable tie wrapped around the mounting ring.

7. The current sensor of claim 1, wherein mounting ring has a height that ranges from about 0.5 inches to about 0.7 inches.

8. The current sensor of claim 1, wherein the mounting ring has an inner diameter that ranges from about 1.25 inches to about 4.15 inches.

9. The current sensor of claim 1, wherein the closed loop ranges from about 360° to about 400°.

10. The current sensor of claim 1, wherein the first end and the second end of the flexible coil form a crossover angle at the crossover point.

11. The current sensor of claim 10, wherein the crossover angle ranges from about 130° to about 140°.

12. A method of measuring alternating current using a current sensor comprising:
    inserting a first end of a flexible coil through a first hole of a mounting ring;
    wrapping the first end of the flexible coil around an inside of the mounting ring;
    crossing the first end of the flexible coil over the second end of the flexible coil to form a crossover point and a crossover angle;
    inserting the first end of the flexible coil through a second hole of the mounting ring to form a closed loop; and
    pulling the first end of the flexible coil through the second hole of the mounting ring.

13. The method of claim 12, further comprising wrapping a cable tie around an outside of the mounting ring.

14. The method of claim 12, wherein the flexible coil has a constant inner diameter and a constant circumference.

15. The method of claim 12, wherein the flexible coil is an open-ended, air core toroidal inductive pickup coil.

16. The method of claim 12, wherein the first hole and the second hole are aligned.

17. The method of claim 12, wherein the loop formed by the flexible coil ranges from about 360° to about 400°.

18. The method of claim 12, wherein the crossover angle ranges from about 130° to about 140°.

19. The method of claim 12, wherein the first hole of the mounting ring and the second hole of the mounting ring are drilled tangentially to an inner diameter of the mounting ring.

* * * * *